United States Patent [19]
Le Queau et al.

[11] Patent Number: 5,138,315
[45] Date of Patent: Aug. 11, 1992

[54] ARRANGEMENTS FOR VARIABLE-LENGTH ENCODING AND DECODING OF DIGITAL SIGNALS

[75] Inventors: Marcel Le Queau, Ozoir-La-Ferriere; Jean-Jacques Lhuillier, Saint-Maur, both of France

[73] Assignee: U.S. Philips Corporation, New York, N.Y.

[21] Appl. No.: 647,626

[22] Filed: Jan. 28, 1991

[30] Foreign Application Priority Data

Jan. 30, 1990 [FR] France ............................ 90 01068
May 15, 1990 [FR] France ............................ 90 06035

[51] Int. Cl.[5] ........................ H03M 7/40; H03M 7/42
[52] U.S. Cl. ............................................ 341/67; 341/106
[58] Field of Search ................ 341/106, 67, 61, 141; 364/239.1, 239.3, 246.3, 246.4, 246.5; 358/12, 13

[56] References Cited

U.S. PATENT DOCUMENTS

| | | |
|---|---|---|
| 4,060,797 | 11/1977 | Maxwell et al. .................... 341/106 |
| 4,302,775 | 11/1981 | Widergren et al. . |
| 4,394,774 | 7/1983 | Widergren et al. . |
| 4,433,377 | 2/1984 | Eustis et al. ........................ 364/200 |
| 5,003,469 | 3/1991 | Kamiyama et al. ................ 364/200 |

*Primary Examiner*—Sharon D. Logan
*Attorney, Agent, or Firm*—Michael E. Marion

[57] ABSTRACT

Arrangement for variable-length encoding of digital signals, divided into N parallel paths, comprising a routing circuit which, after classification of the encoded signals in accordance with their lengths and classification of the buffer memories in accordance with their filling states, apply those signals to the buffer memories which are less filled as said signals are longer, said routing circuit being arranged between a variable-length encoding circuit and rate control circuit. The corresponding decoding arrangement, which receives said encoded signals in regrouped data blocks accompanied by a respective path indicator for said blocks, comprises, at the output of an inverse quantization circuit, a circuit for routing said blocks as a function of the associated path indicator.

9 Claims, 6 Drawing Sheets

ARRANGEMENTS FOR VARIABLE-LENGTH ENCODING AND DECODING OF DIGITAL SIGNALS

BACKGROUND OF THE INVENTION

The invention relates to an arrangement for variable-length encoding of digital signals, divided into N parallel paths, successively comprising in each path quantization means, variable-length encoding means and rate control means including buffer memories, as well as to an arrangement for variable-length decoding.

The article "A flexible architecture for a HDTV codec based on DCT", by M. Barbero, S. Cucchi and J. L. Hernando-Bailon, vol. III of the document "Proceedings of the Third International Workshop on HDTV", Turin (Italy), 30 Aug.-1 Sept. 1989 describes an encoding system intended for a rate reduction of information to be transmitted in which N parallel variable-length encoding paths are provided which are preceded by a demultiplexer for the input signals and followed by a multiplexer for supplying the output signals of the arrangement.

Before specifying the possibilities and the limitations of such an arrangement, it is useful to revert to the encoding operations in a transmission path of digital signals having a fixed rate after variable-length encoding. U.S. Pat. No. 4,394,774 describes an embodiment of the variable-length encoding arrangement with which such a transmission can be carried out. Particularly FIG. 2 of this Patent shows that the arrangement described successively comprises a discrete cosine transform circuit, a normalization circuit, a quantization circuit, a variable encoding circuit and a rate control circuit supplying the control signals applied to the quantization circuit and the output signals at a fixed rate of the encoding arrangement. For the sake of simplification of the description of such an arrangement, the "quantization circuit" is also understood to mean the sub-assembly which performs the cosine transform, normalization and quantization functions and it is this simplified description which will be referred to hereinafter.

In an encoding arrangement formed in this way the signals to be transmitted in the transmission channel thus first traverse the quantization circuit. The output signal of this circuit is encoded in the variable-length encoding circuit and the result of this encoding is applied to the buffer memory of the rate control circuit. At the output of this circuit the transmission channel extracts, at a fixed frequency, the digital signals stored in said buffer memory. Simultaneously, the quantization step is controlled by the filling state of this buffer memory in such a way that this memory is never completely filled or completely empty: the step is augmented when the buffer memory tends to get too full and is reduced when it empties too fast. In order that this regulating operation can proceed correctly, the buffer memory should have at least a given storage capacity value, which will hereinafter be referred to as C, or minimum storage capacity.

The operation of such an encoding arrangement does not present any problem, except for the fact that in the available technology the frequency is limited and that the desired frequency is higher than this limited frequency. This problem is generally solved in the following manner. As there is a ratio N between the maximum theoretical frequency desired for the arrangement and the real maximum frequency which can be used in the technology, the technical solution is to demultiplex the input signals and to apply them to N parallel paths. These N paths are identical and independent and each of them functions as the abovedescribed encoding arrangement, this time, however, at an operating frequency which is compatible with that used in the technology. It is such a structure having N parallel paths which is described in the first-mentioned document.

The reference $F_{max}$ denotes the maximum frequency which can be really used in each one of the N paths to make such a structure work, the reference $NF_{max} = F_{MAX}$ denotes the maximum frequency which is desired for the encoding arrangement and the reference NC denotes the minimum storage capacity which would be indispensable for the buffer memory of the rate control circuit in the case of a conventional series structure which is to operate at the frequency $F_{MAX}$. In the case of a structure having N parallel paths, the minimum storage capacity of the buffer memory provided in each one of the N paths may theoretically be reduced to $NC/N = C$ because the operating frequency $F_{max}$ is N times smaller.

In practice it is unfortunately impossible to adopt such a value because a rate control which is equivalent to that provided by a single buffer memory having a capacity of NC cannot be effected with N buffer memories having a capacity of C. Thus, after demultiplexing and variable-length encoding in each one of the N paths, the information thus encoded may be distributed quite unevenly over these paths and consequently over the N buffer memories. At the limit the total encoded information could be concentrated in a single path, while none of the (N−1) other paths and their buffer memories would be used anymore. To realise the rate control function effectively, this implies that each one of the N buffer memories should have a minimum storage capacity which is equal to NC and not to C as one might believe. The result is that the equivalent buffer memory of the encoding arrangement has a storage capacity which is equal to $N \times N \times C = N^2 C$, i.e. this capacity must be N times larger than in the case of an equivalent series structure where the storage capacity value is NC.

SUMMARY OF THE INVENTION

A first object of the invention is to remedy this drawback by proposing an encoding arrangement with which a minimum storage capacity proximate to that of the equivalent series structure can be simply obtained for a structure having N parallel variable-length encoding paths.

To this end the invention relates to an encoding arrangement which is characterized in that it also comprises routing means which, after classification of the encoded signals in accordance with their increasing or decreasing lengths and classification of the buffer memories in accordance with their decreasing or increasing filling states, apply the encoded signals to the buffer memories which are less filled as said encoded signals are longer, said routing means being arranged between said variable-length encoding means and said rate control means.

In a particular embodiment in which the encoding arrangement successively comprises a circuit for demultiplexing the sequence of input signals into N subsequences applied to N parallel outputs of said circuit, N parallel paths for variable-length encoding of said N respective sub-sequences, and a circuit for multiplexing the N sub-sequences of the signals thus encoded and applied to the outputs of said N paths, said paths each comprising a circuit for quantizing the input signals of the path, a circuit for variable-length encoding of the signals thus quantized and a rate control circuit associating with a buffer memory a feedback connection connecting said memory and the quantization circuit, this arrangement also comprises:

(A) at the output of the encoding sub-assembly constituted by the N variable-length encoding circuits, a circuit for classifying the encoded signals as a function of their length;

(B) at the output of the rate control sub-assembly constituted by the N rate control circuits, a circuit for classifying the buffer memories in accordance with their filling state;

(C) between said encoding sub-assembly and said rate control sub-assembly a routing circuit for applying, in response to a control circuit, the encoded signal corresponding to the one having the smallest length to the input of the buffer memory corresponding to the one which is most filled, the encoded signal corresponding to the one having the largest length to the input of the buffer memory corresponding to the one which is least filled, and, likewise, each of the encoded signals corresponding to the ones having increasingly larger lengths to each one of the inputs of the buffer memories corresponding to the ones which are less and less filled;

(D) at the output of the encoding sub-assembly, between this sub-assembly and said routing circuit, a delay sub-assembly comprising a delay circuit for each path and intended to ensure the synchronism of the encoded signals with the corresponding routing commands.

With this embodiment it is possible and advantageous to provide only a single feedback connection connecting any one of the buffer memories to each quantization circuit.

Another object of the invention is to propose a variable-length decoding arrangement which is capable of ensuring an efficacious and correct decoding of the digital signals after they have been submitted to a variable-length encoding operation as described hereinbefore.

To this end the invention relates to a variable-length decoding arrangement which is characterized in that said encoded signals are regrouped into data blocks accompanied by a path indicator for said blocks, and in that said decoding arrangement also comprises, at the output of said inverse quantization means, means for routing said blocks as a function of the associated path indicator.

In a particular embodiment in which the decoding arrangement successively comprises a circuit for demultiplexing the sequence of input signals into N sub-sequences applied to N parallel outputs of said circuit, N parallel paths for variable-length decoding of said respective sub-sequences, said paths each comprising a buffer memory for storing the input signals of the path, a circuit for variable-length decoding of the signals thus quantized and a circuit for inverse quantization of the signals thus decoded, this decoding arrangement is particularly characterized in that said routing means comprise:

(a) a switching circuit having N switches with one input and N outputs, whose N respective positions are determined by means of N elements for transcoding the path indicator associated with each block;

(b) a transcoding circuit regrouping said transcoding elements;

(c) between the N inputs of said routing means and the N respective inputs of said switching circuit, a delay circuit having N delay elements associated with each respective path;

(d) a multiplexing circuit having N inputs connected, respectively, to one of the N outputs of said switches, said circuit being provided for supplying a continuous sequence of blocks arranged in accordance with the associated path indicator.

BRIEF DESCRIPTION OF THE DRAWING

The invention will now be described in greater detail by way of example with reference to the accompanying drawings in which.

BRIEF DESCRIPTION OF THE EMBODIMENTS OF THE INVENTION

Figure 1:
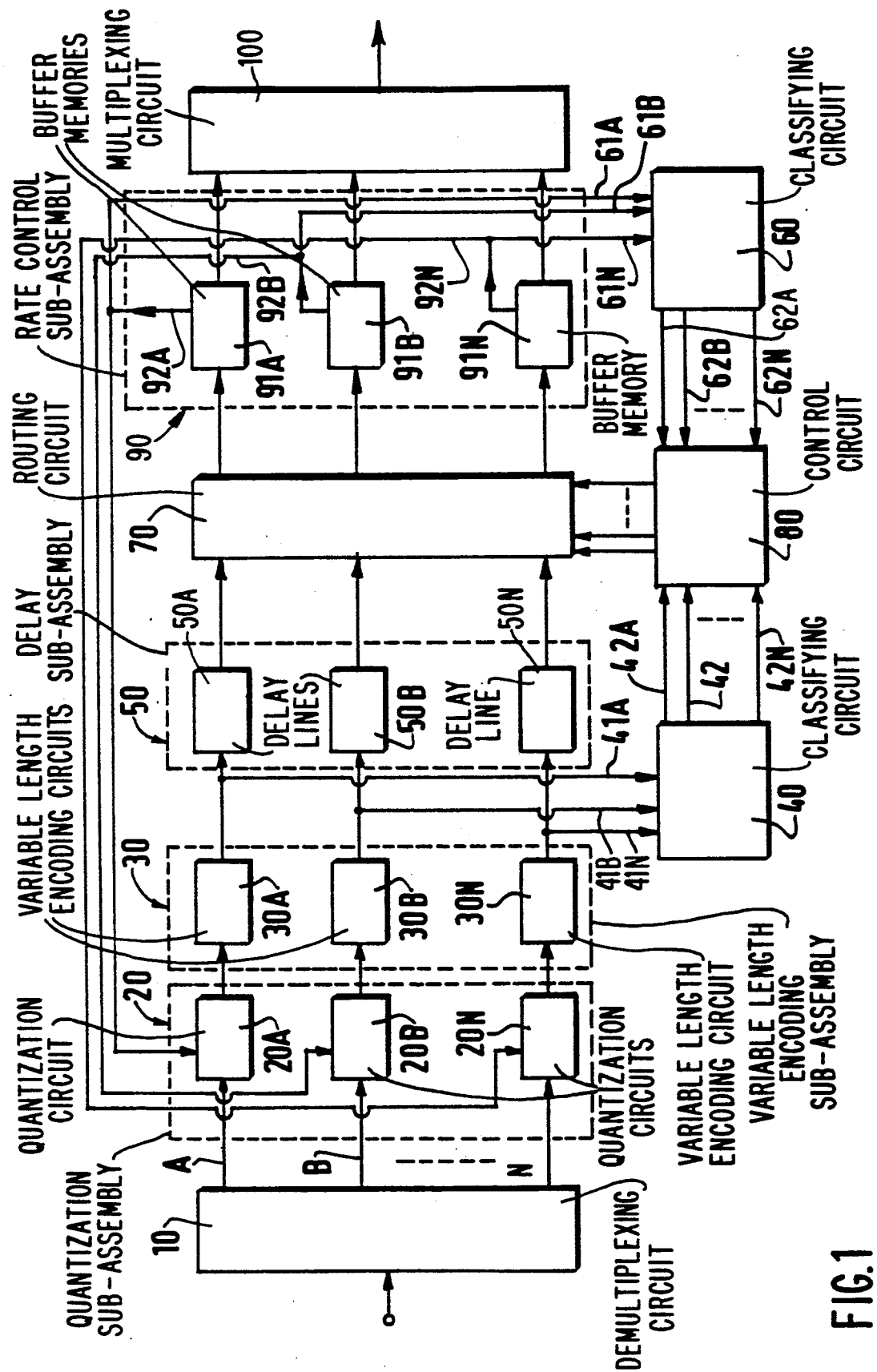
FIG. 1 shows a particular embodiment of an encoding arrangement according to the invention.
Figure 2:
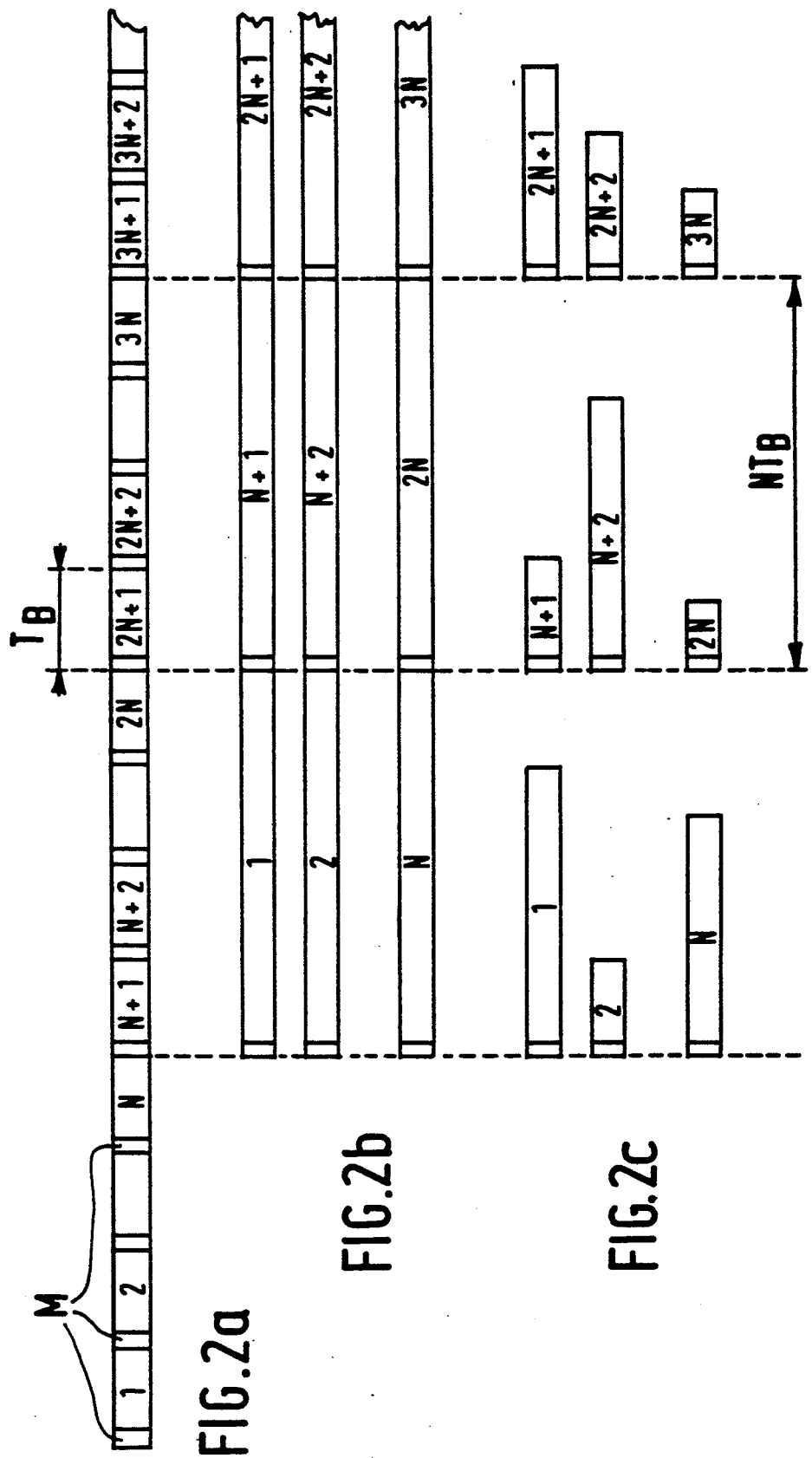
FIG. 2a shows an abstract of the continuous sequence of signals at the input of the encoding arrangement of FIG. 1 in the form of blocks (starting with the number 1) separated in regular intervals by special words M.
FIG. 2b shows the N sequences of corresponding blocks at a frequency which is N times lower at the input of the N parallel paths of the encoding arrangement.
FIG. 2c shows, in concordance with the N sequences of blocks of a given length shown in FIG. 2b, an example of N corresponding sequences of variable-length encoded signals.

The encoding arrangement shown in FIG. 1 and supplying the encoded signals such as those treated by the decoding arrangement according to the invention to be described hereinafter comprises the following elements in this embodiment. A demultiplexing circuit 10 receives the input signals from the encoding arrangement. These input signals, which are originally presented in the form of a continuous flow of bits, have previously been separated at regular intervals by special words cutting up this flow into blocks of fixed length. In the case of encoding television signals the continuous sequence of signals is cut up, for example, into blocks of eight consecutive picture lines. These blocks succeed one another at the input of the demultiplexing circuit 10 at a frequency of $F_m$ corresponding to one period $T_B$. At the output of the circuit 10 the same blocks appear in a demultiplexed form in N distinct paths A to N at the frequency of $F_m/N$ and with a period of $NT_B$. FIG. 2a shows the continuous sequence or blocks 1, 2, ..., N, N+1, N+2, ..., 2N. 2N+1, 2N+2, ..., 3N, 3N+1, ..., etc. ..., separated at regular intervals by special words M, and FIG. 2b shows the N corresponding sequences at a frequency which is N times lower at the input of the N parallel paths.

These N parallel paths, denoted by A to N each comprise a quantization circuit 20A to 20N, respectively, while the regrouping of these N circuits constitutes a quantization sub-assembly 20 (which, as indicated above, performs the traditional functions of cosine transform, normalization and quantization in each path). Each quantization circuit 20A to 20N receives one of the N available sequences at the input of N paths, as shown in FIG. 2b: for example, the quantization circuit 20A receives the sequence of blocks 1, N+1, 2N+1, 3N+1, ..., etc. ..., present at the input of the first path, the circuit 20B receives the sequence of blocks 2, N+2, 2N+2, 3N+2, etc..., present at the input of the second path, and so forth.

In each path the quantization circuit is succeeded by a variable-length encoding circuit 30A to 30N, respectively, while the regrouping of these N circuits constitutes a variable-length encoding sub-assembly 30. Each circuit 30A to 30N receives the quantized signals supplied by the respective associated quantization circuit and supplies variable-length encoded words corresponding to each block of fixed length. FIG. 2c shows, in concordance with the N sequences of blocks of a given and fixed length shown in FIG. 2b, an example of N corresponding sequences of variable-length encoded signals.

Each output signal of the variable-length encoding circuits 30A to 30N is thus applied to:

(a) a respective input of a circuit 40 for classifying the encoded signals in accordance with their length, for example, in accordance with increasing lengths at the N inputs denoted 41A to 41N of the circuit 40 which correspond to N outputs 42A to 42N indicating, respectively, the path number of each path resulting from the classification;

(b) an input of a delay sub-assembly 50 constituted by N delay lines 50A to 50N, the delay of these lines being such that the classification effected by the circuit 40 is realized before the encoded signals from the variable-length encoding sub-assembly 30 appear at the output of said delay lines.

Substantially simultaneously with the classification performed by the circuit 40, a circuit 60 for classifying the paths performs a classification of N paths A to N in accordance with the filling states of the N associated buffer memories 91A to 91N, respectively, constituting the last circuit of each path. The order of classification (decreasing filling states) is inverse to that chosen for the classification of the previously described lengths. The output signals indicating the N filling states which correspond to N memories of the paths A to N are applied to N inputs 61A to 61N of the classification circuit 60 whose outputs 62A to 62N indicate the path number of the paths A to N, respectively, resulting from the classification of the filling states. The delay of the lines 50A to 50N is chosen in such a way that the classification effected by the circuit 60 is terminated before the encoded signals from the variable-length encoding sub-assembly 30 appear at the output of the delay lines 50A to 50N.

The delay sub-assembly 50 is succeeded by a circuit 70 for routing from N paths to N paths, subsequently by N rate control circuits (91A, 92A) to (91N, 92N) constituting a rate control sub-assembly 90. As stated hereinbefore, each of these rate control circuits is situated in one of the N parallel paths and comprises said buffer memory 91A to 91N, respectively, as well as a feedback connection 92A to 92N, respectively, intended to act on the associated quantization circuit in accordance with the filling state of the corresponding buffer memory.

The routing from N paths to N paths effected by the circuit 70 is realized in the following manner. Upstream of the routing circuit the paths conveying the blocks having the largest length are associated with the paths downstream of the routing circuit, which paths are associated with the buffer memories whose filling states are the smallest. More particularly, via one of the N connections of the circuit 70, the output of the sub-assembly 50 which corresponds to the largest length of the encoded block is connected to the input of the sub-assembly 90 which corresponds to the buffer memory whose filling state is the smallest and subsequently, via another connection, the output of the sub-assembly 50 corresponding to the smallest length of the encoded block is connected to the buffer memory whose filling state is the highest and, similarly between these two extreme connections, the (N−2) remaining connections of the sub-assembly 50 are connected to (N−2) inputs of the remaining buffer memory by pairwise associating the increasing (or decreasing) lengths of the encoded signal with the buffer memories which are least filled (or most filled, respectively).

Figure 3:
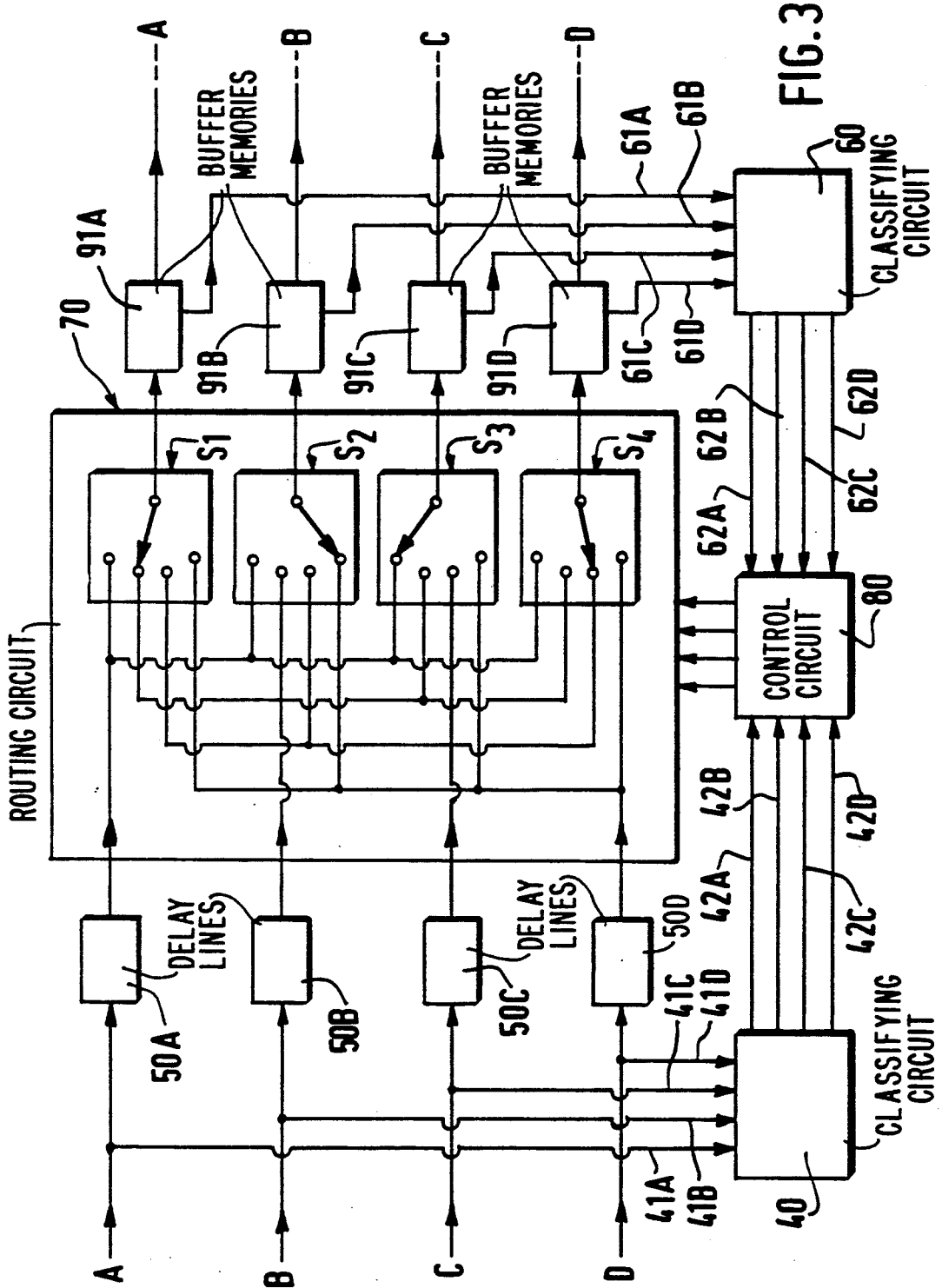
FIG. 3 shows a particular embodiment of essential circuits in the encoding arrangement of FIG. 1 for four parallel paths, i.e. for N=4.

The routing is thus controlled by the classification of the lengths effected by the circuit 40 and by the classification of the buffer memories effected by the circuit 60 by means of a control circuit 80. More specifically, a manner of realising this routing operation is described with reference to FIG. 3 showing a concrete example in which N is equal to 4. As is shown in this FIG. 3, the routing circuit 70 is constituted by four switches $S_1$, $S_2$, $S_3$, and $S_4$ each having four positions. If, for example 4, 3, 1, 2 is the classification of the paths A, B, C, D, respectively, upstream of the routing circuit in accordance with the increasing lengths of the blocks, then 3, 2, 4, 1 is the classification of the same paths downstream of the routing circuit in accordance with the decreasing filling states of the buffer memories associated with these paths. Based on what has been stated hereinbefore, it can be deduced that the upstream path A must be connected to the downstream path C, the upstream path B to the downstream path A, the upstream path C to the downstream path D and the upstream path D to the downstream path B. These four connections between the upstream paths and the downstream paths are indicated in Table 1 as a function of their classification:

TABLE 1

| Classification | Paths upstream | Paths downstream |
| --- | --- | --- |
| 1 | C | D |
| 2 | D | B |
| 3 | B | A |
| 4 | A | C | and illustrated by the positions of the four switches shown in FIG. 3. However, this Table 1 may also be in the form of the following Table 2:

TABLE 2

| Position of switch | Number of switch |
| --- | --- |
| 2 | 1 |
| 4 | 2 |
| 1 | 3 |

TABLE 2-continued

| Position of switch | Number of switch |
|---|---|
| 3 | 4 |

To establish the four correct connections in conformity with the classifications of lengths and the filling states effected upstream and downstream of the routing circuit, the switch $S_2$ should be in position 4, the switch $S_4$ should be in position 3, the switch $S_3$ should be in position 1 and the switch $S_1$ should be in position 2, respectively, in the example described.

Figure 4:
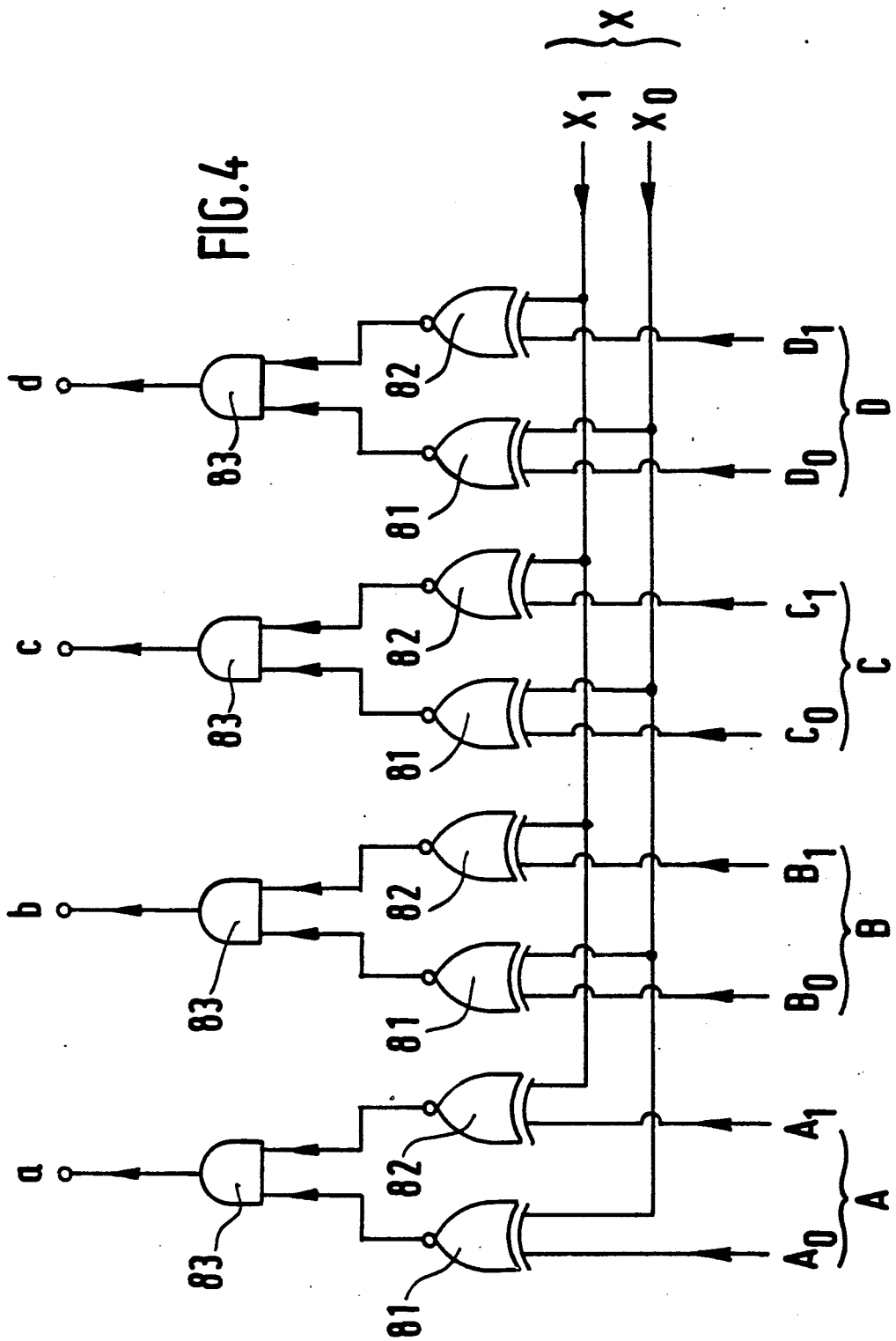
FIG. 4 shows an embodiment of the arbitrary control position of a switch $S_x$, in this case of four parallel paths.

A possible realisation of controlling the position of an arbitrary switch $S_x$ is shown diagrammatically in FIG. 4. The inputs $A_o$, $B_o$, $C_o$, $D_o$ of four exclusive-OR circuits 81 correspond to the small weight classification bits of the upstream paths A, B, C, D and the inputs $A_1$, $B_1$, $C_1$, $D_1$ of the four other exclusive-OR circuits 82 correspond to the bits having the largest weight. The inputs $X_o$ and $X_1$ correspond to the small weight bits and the large weight classification bits, respectively, of the downstream path X. The truth table of the logic circuit, completed by four AND gates 83 is built up in such a way that the logic level "1" appears at one of the four outputs a, b, c, d corresponding to the positions 1, 2, 3, 4, respectively of the switch $S_x$, and the logic level "0" appears at the three other outputs. As the logic level "1" indicates which one of the four upstream paths A, B, C, D has the same classification as the downstream path X, it is clear that the position of this logic level "1" directly controls the position of the switch.

In the example described, which corresponds to N=4, the control circuit 70 is constituted by four logic circuits which are identical to those described in FIG. 4, because there are four switches to be controlled. This implies that in the case of N paths this circuit 70 can be realized with the aid of N identical logic circuits each constituted by N AND gates and (M×N) exclusive-OR logic circuits, where M is the number of bits required for indicating the classification of a path.

By thus associating N encoded and classified blocks according to their increasing for decreasing) measured lengths with N buffer memories inversely classified according to their decreasing (or increasing, respectively) filling states, it is ensured that a type of indicator of the origin of a block is preserved, for example, by inscribing in or at the side of each block the number of the output of the demultiplexing circuit 10 from which it originates. This information relating to the indication of the origin of each block is indispensable at the receiving and decoding side, as will be apparent hereinafter, for reconstructing the output sequence of the decoded digital signals and must thus be transmitted at the same time as the signals relating to the block itself. Said transmission of the output signals of each path and the indications of origin of the contents of each buffer memory is ensured in a sequential manner after regrouping the total information with the aid of a multiplexing circuit 100.

With the structure of the encoding arrangement thus described the encoded information is thus evenly distributed over the N buffer memories independently of the original distribution over the N outputs of the demultiplexing circuit 10. In this non-limitative case of a sequential extraction of the data of these N buffer memories effected by interrogation in a regular rhythm, it is demonstrated that the difference between their filling states at a given instant cannot exceed the length L of an encoded block. As a result the minimum storage capacity of each buffer memory of the encoding arrangement is now equal to C+L, i.e. proximate to C, while it would be equal to NC in the prior-art solution to the present invention. Also as a result of this similarity between the filling states, a single feedback connection can feed the N quantization circuits so as to ensure the rate control in an effective manner because all the buffer memories are now in identical or very approximate filling states.

Figure 5:
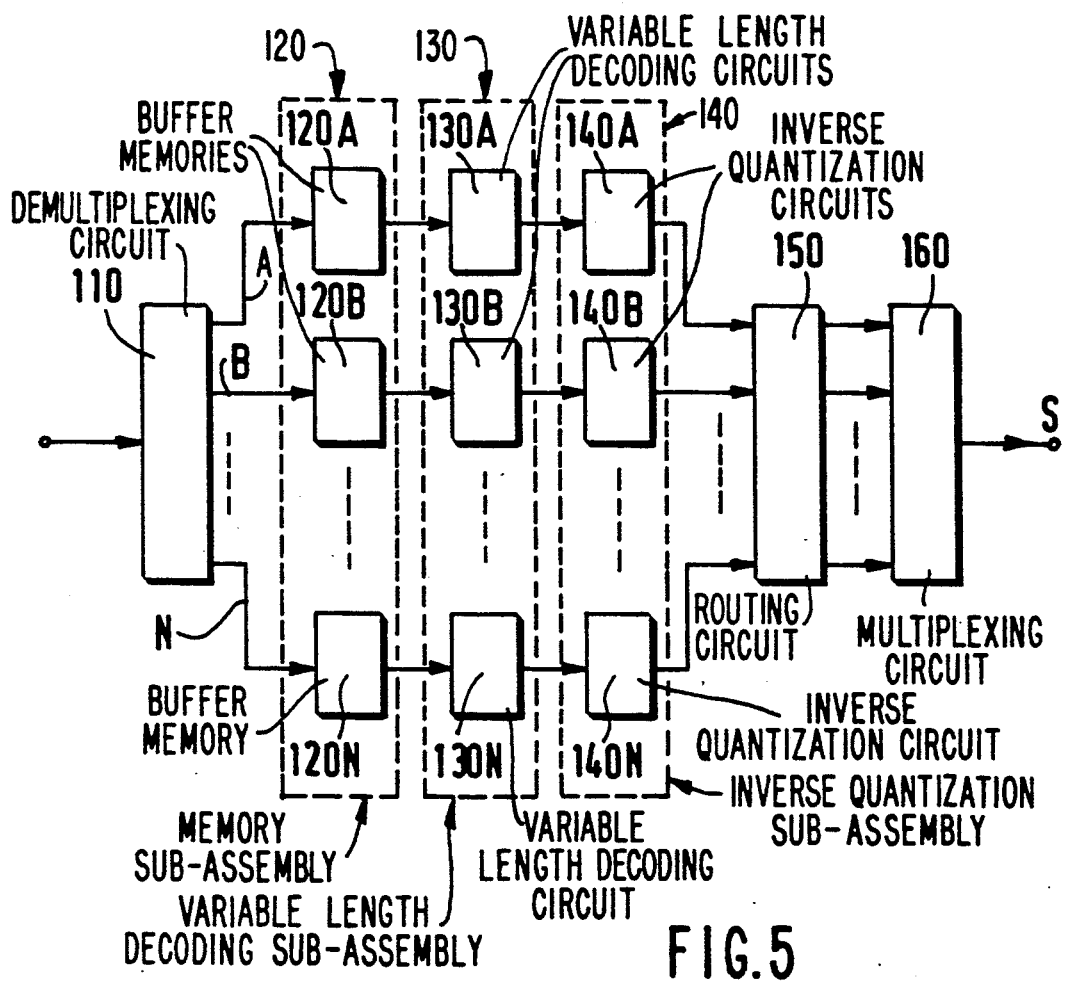
FIG. 5 shows a particular embodiment of a decoding arrangement according to the invention.
Figure 6:
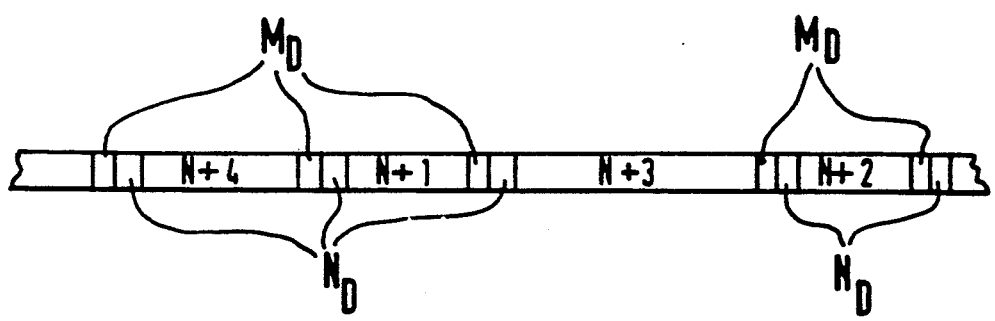
FIG. 6 shows an abstract of the continuous sequence of signals at the input of the decoding arrangement of FIG. 5.

Conversely, when digital signals are submitted to a variable-length encoding of the type described hereinbefore, it is important to correctly ensure the decoding of signals thus encoded by minimizing the capacity of the buffer memory required in the course of this decoding operation. This object can be achieved with the decoding arrangement shown in a particular embodiment in FIG. 5. In this embodiment the arrangement comprises the following elements. A demultiplexing circuit 110 realising the inverse operation of that effected by the multiplexing circuit 100 receives the previously encoded digital signals. These input signals are provided in the form of a continuous flow of bits arranged in variable-length code words describing the blocks. As is shown in FIG. 6, these blocks (here, for example, N+4, N+1, N+3, N+2 ... )are separated from each other by special words $M_D$ corresponding to words M of FIG. 2a, and each word $M_D$ is followed by the number $N_D$ of the output of the demultiplexing circuit 10 from which it originates in the encoding arrangement.

At the output of the demultiplexing circuit 110 these input signals are distributed over N distinct and parallel paths A to N. These N paths, Which are provided for performing the inverse operations of those effected by the paths A to N of the encoding arrangement of FIG. 1, each comprise a buffer memory 120A to 120N, respectively, while the regrouping of these N memories constitutes a memory sub-assembly 120. It is demonstrated that the capacity of this memory sub-assembly is minimized when the demultiplexing circuit 110 realises the inverse operation of that effected by the multiplexing circuit 100 of the encoding arrangement.

Each buffer memory is followed by a variable-length decoding circuit 130A to 130N, respectively, while the regrouping of these N circuits constitutes a variable-length decoding sub-assembly 130. Each of these circuits is in turn followed by an inverse quantization circuit 140A to 140N, respectively, while the regrouping of these N circuits constitutes an inverse quantization sub-assembly 140 which performs in each path the inverse assemblies of the N encoding paths, namely: inverse quantization, inverse normalization, inverse discrete cosine transform. These variable-length decoding operations are described in the above-mentioned U.S. Pat. No. 4,394,774 and will therefore not be repeated in this description.

Figure 7:
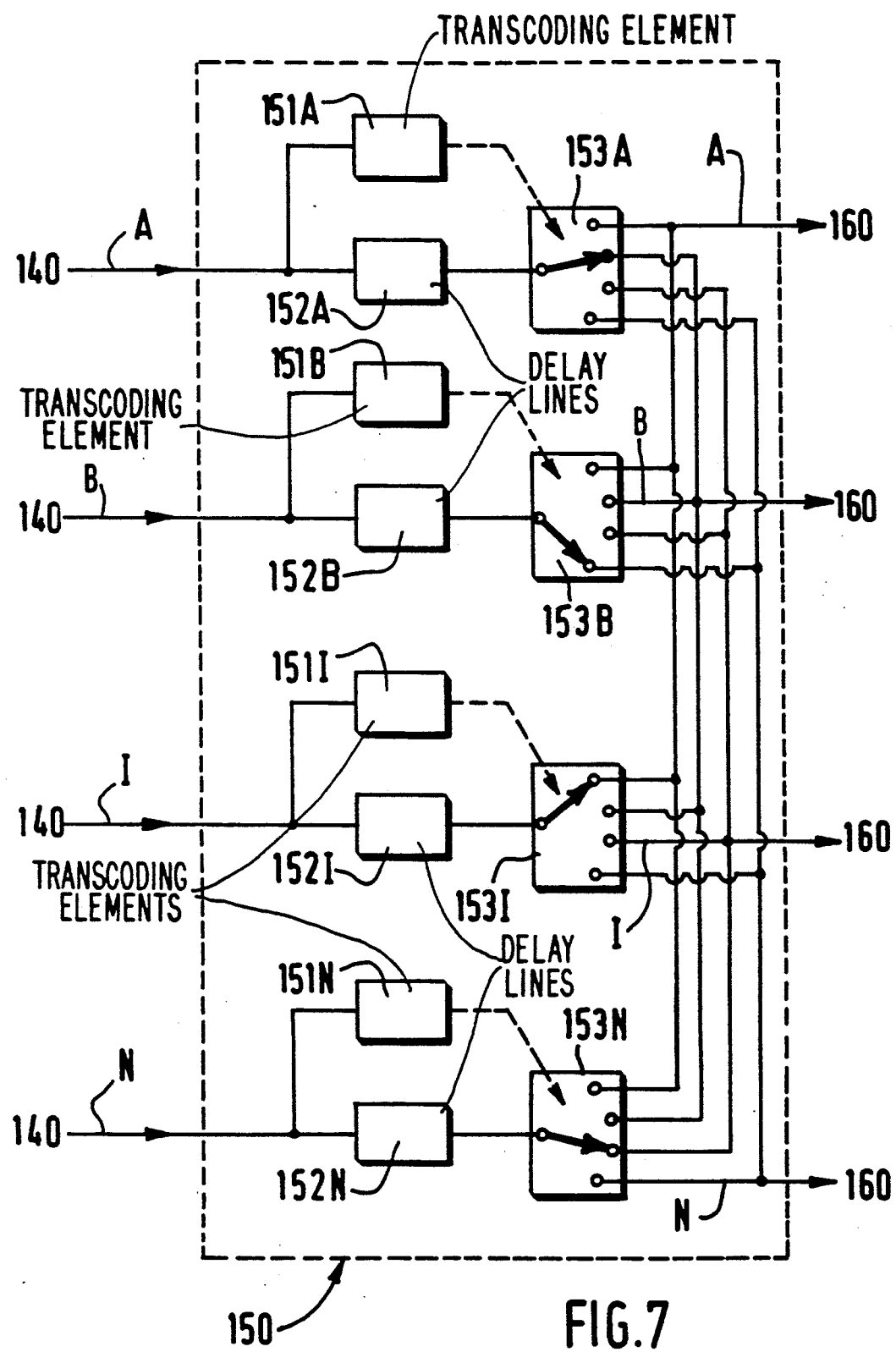
FIG. 7 shows an embodiment of the routing circuit of the decoding arrangement of FIG. 5.

Each output of the inverse quantization circuits 140A to 140N is connected to a circuit 150 for routing from N paths to N paths and realized in the following way. As is shown in FIG. 7, a transcoding circuit composed of transcoding elements 151A, 151B, ... 151I, ... , 151N extracts from the data at the input of this routing circuit for each path A to N the number of the output of the demultiplexing circuit 10 of the encoding arrangement from which the block which follows this number originates. Based on this number, which is an indicator of the order of the block in the sequence of the original signals, the transcoding circuit (151A, 151B, ..., 151I, ..., 151N) determines the position of the corresponding switches 153A, 153B, ..., 153I, ..., 153N forming a switching circuit. This determination of the position is realized in such a way that the block following each number is routed to the path carrying same index A, B, ..., I, ... N as that assumed by the block at the output of the demultiplexing circuit 10 (the number directly corresponding to the position of the switch). A delay circuit composed of delay elements 152A, 152B, ..., 152I, ..., 152N delays the data by a period of time which is necessary when the position of the switches 153A, 153B, ..., 153I, ..., 153N has been determined and occupied.

Each one of the N outputs of the routing circuit 150 is connected to a corresponding input of a multiplexing circuit 160 whose output S supplies the output signals of the decoding arrangement.

We claim:

1. An arrangement for variable-length encoding digital signals having a signal input and a signal output, said arrangement comprising:
   a) N parallel paths having N path inputs coupled to said signal input, and N path outputs providing N output signals, where N is an integer, each path comprising:
      i. means for quantizing said digital signals so as to provide quantized signals; and
      ii. means for variable-length encoding said quantized signals so as to provide encoded signals;
   b) rate control means coupled to said signal output, comprising a plurality of buffer memories; and
   c) routing means disposed between said N path outputs and said rate control means, for applying each of said encoded signals to a respective one of said buffer memories selected on the basis of the length of each respective encoded signal and respective filling states of said buffer memories.

2. The arrangement as claimed in claim 1, wherein each of said buffer memories provides a buffer memory signal output and wherein said arrangement further comprises:
   a) means coupled to said signal input, for demultiplexing a sequence of input signals into N digital signals, said demultiplexing means having N parallel outputs each coupled to one of said N path inputs; and
   b) means coupled to said rate control means, for multiplexing a plurality of said buffer memory output signals so as to provide a data output to said signal output.

3. An encoding arrangement as claimed in claim 2, wherein the rate control means comprises a single feedback connection connecting any one of the buffer memories to said quantization means.

4. The arrangement as claimed in claim 2, wherein each of said paths further comprises means, disposed between said variable-length encoding means and said N path outputs, for providing for each respective path, a delay to ensure synchronism of said encoded signals with said routing means.

5. The arrangement as claimed in claim 2, wherein said data output is provided as a sequence of data blocks each comprising an associated path indicator.

6. An arrangement for decoding the data blocks described in claim 5, said arrangement comprising:
   a) means for demultiplexing said sequence of data blocks into N data block signals;
   b) N parallel decoding paths each coupled to said demultiplexing means so as to receive one of said N data block signals, each path comprising:
      i. means for storing data blocks so as to provide stored encoded signals;
      ii. means for variable-length decoding said stored data block signals so as to provide decoded signals; and
      iii. means for inverse quantizing said decoded signals so as to provide decoded data blocks at a respective decoded path output;
   c) means coupled to each said decoded path output, for routing each of said decoded data blocks as a function of the associated path indicator.

7. The arrangement of claim 6, wherein said routing means comprises:
   a) a switching circuit having N switches, each switch having a switch input coupled to one of said decoded path outputs, and N switch outputs; and
   b) a transcoding circuit comprising N transcoding elements each having an input coupled to one of said decoded path outputs for receiving the associated path indicators of decoded data blocks, and an output coupled to a respective one of said switches so as to couple each decoded data block to a selected witch output as a function of the associated path indicator.

8. The arrangement of claim 7, wherein said routing means further comprises N delay circuits, each of said delay circuits being coupled between one of said decoded path outputs and one of said switch inputs.

9. The arrangement of claim 8 further comprising means coupled to each of said switch outputs, for multiplexing said decoded data blocks so as to form a continuous sequence of data blocks arrange in accordance with respective associated path indicators.

* * * * *